United States Patent

Plankl et al.

[11] Patent Number: 5,473,109
[45] Date of Patent: Dec. 5, 1995

[54] RF-SHIELDING HOUSING FOR A CIRCUIT, FOR EXAMPLE FOR THE CONTROL CIRCUIT OF A MOTOR-VEHICLE AIR-BAG

[75] Inventors: Christian Plankl, Fussenberg; Robert Gruber, Regensburg; Josef Dirmeyer, Bodenwöhr-Neuenschwand, all of Germany

[73] Assignee: Siemens Aktiengesellschaft, Munich, Germany

[21] Appl. No.: 50,008
[22] PCT Filed: Dec. 3, 1991
[86] PCT No.: PCT/EP91/02282
§ 371 Date: Apr. 22, 1993
§ 102(e) Date: Apr. 22, 1993
[87] PCT Pub. No.: WO92/11745
PCT Pub. Date: Jul. 9, 1992

[30] Foreign Application Priority Data

Dec. 21, 1990 [EP] European Pat. Off. ............ 90125287

[51] Int. Cl.⁶ ..................................................... H05K 9/00
[52] U.S. Cl. ........................ 174/35 C; 361/818; 439/607
[58] Field of Search ........................... 174/35 R, 35 C, 174/35 GC, 50.52, 50.59; 439/607, 609, 610; 361/800, 816, 818

[56] References Cited

U.S. PATENT DOCUMENTS

| 5,013,262 | 5/1991 | Shibano ................................. | 439/610 |
| 5,253,143 | 10/1993 | Klinger et al. ........................ | 361/736 |
| 5,273,459 | 12/1993 | Davis ..................................... | 439/607 |
| 5,307,242 | 4/1994 | Seibold et al. ......................... | 361/816 |
| 5,336,098 | 8/1994 | Zell et al. .............................. | 439/108 |
| 5,392,197 | 2/1995 | Cuntz et al. ............................ | 361/818 |
| 5,417,590 | 5/1995 | Dechelette et al. ................... | 439/607 |
| 5,418,685 | 5/1995 | Hussmann et al. ............. | 174/356 C X |

FOREIGN PATENT DOCUMENTS

| 0385689 | 9/1990 | European Pat. Off. . |
| 2216333 | 10/1973 | Germany . |
| 2813457 | 10/1979 | Germany . |
| 9013539 | 1/1991 | Germany . |
| WO91/14601 | 10/1991 | WIPO . |

Primary Examiner—Morris H. Nimmo
Assistant Examiner—Christopher Horgan
Attorney, Agent, or Firm—Hill, Steadman & Simpson

[57] ABSTRACT

An RF-shielding multicomponent metallic or metal-coated circuit housing (W, D) contains a printed circuit board (L), and a plug (S) which is connected to plug terminals (P) provided in the printed circuit board (L). A housing section (W) has a bay (E/B) which has metallic or metal-coated walls (B) which are at housing potential in the assembled state of the housing (W, D) and in which (E/B) the plug (S) is mounted. The bay (E/B) is open at one side face (M), the "open side face" (M), facing the inside (Q) of the housing, the bay (E/B) having edges (C) situated in a single plane and facing the open side face. The open side face (M) is covered by the printed circuit board (L) in the assembled state of the housing (W, D). The printed circuit board (L) is coated over a large area of its section (M) facing the bay (E/B) with a conducting layer (M) in such a way that strips of said layer (M) rest on the edges (C) in the assembled state of the housing (W, D) so that the layer (M) covers the bay (E/B) and the layer (M) is then at housing potential.

5 Claims, 1 Drawing Sheet

RF-SHIELDING HOUSING FOR A CIRCUIT, FOR EXAMPLE FOR THE CONTROL CIRCUIT OF A MOTOR-VEHICLE AIR-BAG

BACKGROUND OF THE INVENTION

1. Field of the Invention

The invention relates generally to a metallic or metal-coated housing, in particular for the air-bag control circuit of a motor vehicle, which provides shielding against radio-frequency radiation, having two housing sections, a printed circuit board mounted in the housing and supporting at least a part of a circuit, and a plug in the housing wall which makes via plug terminals the connection between the circuit, on the one hand, and electrical parts situated outside the housing, on the other hand, and which is already well known to the person skilled in the art, particularly one skilled in the art of motor-vehicle electronics.

The invention therefore relates to shielding circuits from RF (radio frequency) interference which acts on them from the outside. The invention also relates to the suppression of RF interference which originates from the circuit and acts on the environment.

2. Description of the Related Art

The invention was in fact initially developed for the air-bag system of a motor vehicle, which air-bag system is intended for installation in the steering wheel hub and is in accordance with Published PCT Application PCT/DE 90/00 423. It was found, however, that the invention can also be applied to other air-bag systems and even, in addition, also to all the other metallic or metal-coated housings which provide shielding against radio-frequency radiation.

In a known housing (as shown in German Utility Model 90 13 539) for shielding a circuit, a plug is provided in the housing wall. The plug is connected to the circuit by means of a connector. The housing of the plug is RF-shielded by a metal shield which surrounds it. The electrical contact to the housing is improved by spring tongues on the metal shield which press against the housing.

In this case, however, the connectors are not, or only partially, shielded inside the housing and may impair the circuit by RF radiation.

A further known housing (Research Disclosure, No. 313, May 1990, Emsworth, GB) has a lid and a base between which a printed circuit board supporting a circuit is clamped in the assembled state. The joints between the lid or base and the printed circuit board are coated with tin in order to improve the RF shielding action of the housing.

In this housing, too, the connectors which connect the plug to the printed circuit board are not shielded inside the housing and may impair the circuit as a result of HF (high frequency) radiation.

A particular problem in such housings, their plugs and their printed circuit boards (particularly in the case of air-bag systems) is the mass production and, in particular, that the components be as reliable and as easy as possible to produce and their subsequent assembly easy and reliable, but without the shielding action being allowed to suffer as a result.

SUMMARY OF THE INVENTION

The object of being able to achieve the reliable, relatively easily manageable mass production at relatively low cost, and of being able, for example, to achieve a reliable and nevertheless low-cost production of motor-vehicle air-bag control circuits shielded from RF interference, is achieved, according to the invention, by the first housing section having a trough-shaped bay which has metallic or metal-coated walls which are at housing potential in the assembled state of the housing and in which the plug and its plug terminals directed towards the circuit are arranged; the bay, which is open only at one of its side faces facing the inside of the housing, having edges lying in a single plane and facing the open side face and on which the printed circuit board, which covers the open side face in the assembled state of the housing is mounted; and the printed circuit board being coated over a large area of its section facing the bay and containing the plug terminals with an electrically conducting layer in such a way that strips of the layer rest on the edges of the bay in the assembled state of the housing so that the layer then covers the bay and the layer is then at housing potential.

The further improvements of the invention make it possible to achieve additional advantages. In particular and inter alia, the additional measures of providing the printed circuit board with a further conducting layer, which is connected in the assembled state of the housing to a potential which is constant with respect to the housing potential, in each case over a large area in at least one further printed circuit board level on the printed circuit board section facing the bay and containing the plug terminals and a plurality of conducting layers situated one above the other covering the bay over a large area in the assembled state of the housing and make it possible to improve the shielding in the region of the open side surface still further, the printed circuit board being metal-coated, at least partly, at its circumference in a U shape and, in particular, being metal-coated both along the outside edge of the printed circuit board and also being metal-coated on the edge strips of the printed circuit board immediately adjacent laterally to the outside edge and conductingly connected to the outside edge, the printed circuit board having a contour which is such that the first edge strip of the printed circuit board rests as tightly as possible, in the assembled state of the housing, on a shoulder face which extends around the first housing section and is then at housing potential, and the second edge strip of the printed circuit board being covered as tightly as possible with a peripheral edge of the lid make it possible to mount the printed circuit board between the base trough and the lid in a manner which is as gap-free as possible and, consequently, with shielding from RF interference, the metal-coated strips of the printed circuit board at which the printed circuit board rests on the edges of the bay and/or at which the printed circuit board makes contact with housing sections along its circumference being thickly coated with soldering material; make it possible to mount the printed circuit board between the base trough and the lid in a manner which is as gap-free as possible and consequently, with shielding from RF interference without high production cost in producing the components concerned and without high assembly cost in the subsequent mounting of the components, and the edges and/or shoulder faces at least of individual parts of the housing sections which are contacted in the assembled state of the housing by the soldering material under pressure being roughened; make it possible to mount a printed circuit board between the base trough and the lid in a manner which has particularly good freedom from gaps and, consequently, has particularly good shielding from RF interference without high production cost in producing the shoulder face concerned and without additional assembly cost in the subsequent mounting of the components concerned.

BRIEF DESCRIPTION OF THE DRAWINGS

The invention and further developments thereof are explained further by reference to an exemplary embodiment of the invention shown in the two figures, which exemplary embodiment has been shown as simply as possible by omitting less important details for the sake of clarity. In the drawing.

DETAILED DESCRIPTION OF THE PREFERRED EMBODIMENTS

Both figures therefore show two different views of one and the same example of the invention, that is to say an RF-shielding multicomponent (in particular, two-component in this case, cf. W and D) metallic or metal-coated circuit housing W/D. The circuit is, for example, the control circuit of a vehicle air-bag. The housing W/D essentially comprises the base trough W and the lid D, it being possible to produce these two components W and D at relatively low cost even by aluminum die casting, for example, in order to achieve the robustness of the housing W/D which is absolutely necessary in a crash.

Figure 1:
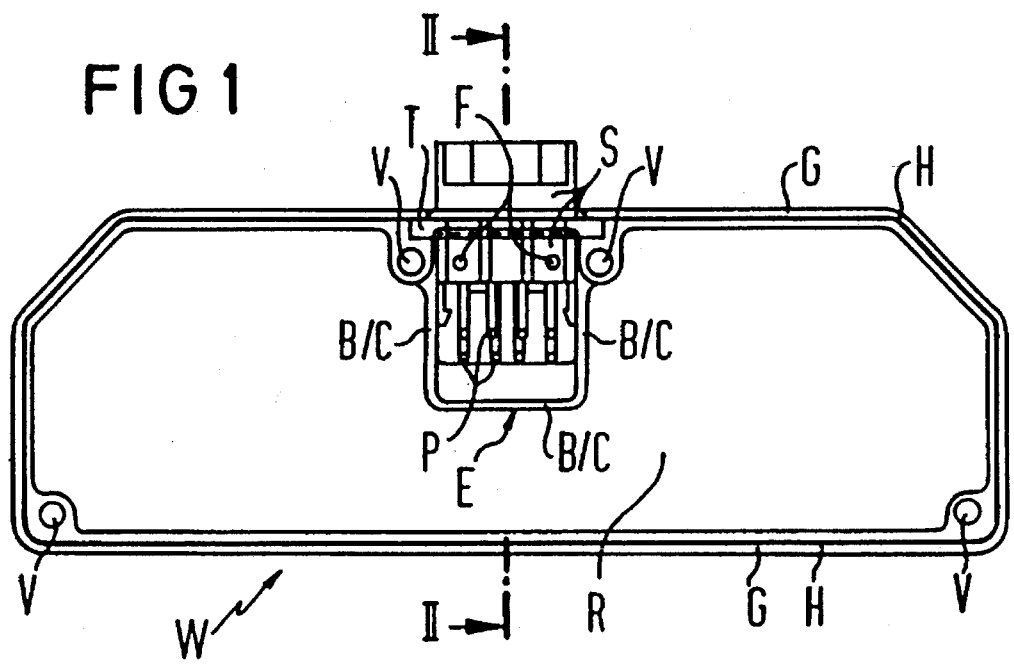
FIG. 1 shows a plan view of the base trough before the printed circuit and the lid have been applied to it.
Figure 2:
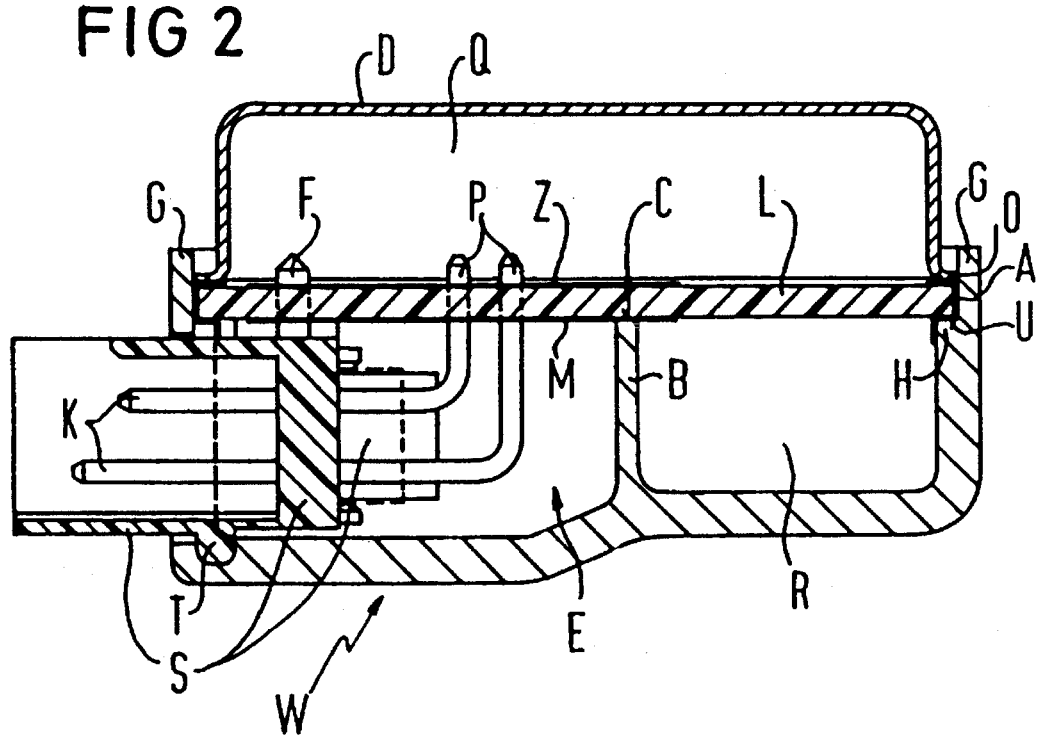
FIG. 2 shows, on a somewhat modified scale, a section through the base trough shown in FIG. 1, but after the printed circuit board and the lid have already been applied.

FIG. 2 shows that, in this example, the printed circuit board L is inserted in the housing W/D in such a way that it covers, in this example, even the entire base trough W shown in FIG. 1. The printed circuit board L rests, in fact, on the shoulder face H which substantially extends round the rim of the base trough W on the inside (cf. the shoulder face H shown in both figures). The printed circuit board L supports at least a part of the circuit concerned, whose individual components may project, in this example of the invention, both into the interior R of the base trough W and into the interior Q of the lid D. The lid D is shaped in such a way that it covers the printed circuit board L and that its lid edge just fits into the border strip G of the base trough W.

Both figures also shown the plug S (in this case the sole plug) which is held by the housing wall W and which is essentially composed, for example, of insulating plastic and its outwardly directed plug pins K. In the example shown, the plug S is attached to the printed circuit board L by means of the plastic studs F molded-on by injection molding. In principle, however, a plurality of such plugs S may also be provided on the housing W/D in the manner according to the invention. The plug S is inserted by means of lateral plastic ribs T in matching slot-type recesses of the base trough W and are consequently held robustly by the base trough W. The plug S has, on its rear side, the pins P which are soldered into the printed circuit board L and form inner plug terminals and which make the electrical connection between the circuit, on the one hand, and electrical parts (in principle of any type whatsoever) situated outside the housing W/D, on the other hand, which parts may, if necessary, be constructed as RF filters for the purpose of interference suppression, for example using attenuation capacitors. The parts situated outside the housing W/D may, for example, be used to supply power to the circuit and/or for testing and indicating purposes. In addition, or alternatively, they may also be used for other purposes, that is to say, for example, to ignite an explosive substance in order to produce gas suddenly for an air bag.

A main object of the invention is to be able to produce the housing W/D, its plug S and its printed circuit board L reliably and at low cost in mass production and subsequently also to be able to assemble everything reliably and in as foolproof a manner as possible without the shielding action suffering as a result. In this connection, the way in which the plug S is mounted is difficult and important, it also being absolutely necessary to achieve the required shielding action in the region of the plug.

The invention discloses a new way of doing this in which the plug S (cf. also the two figures) may be essentially composed of insulating material in the case of the invention, that is to say it does not exert any shielding action itself. However, the invention makes it possible to provide, in addition, in and/or on the plug S itself the shielding measures known for the latter, for example metal inserts or metal coatings. Experiments have shown, however, that it is generally sufficient in the case of the invention, even under the strict conditions relating to air-bag controls, to make the plug S essentially only of an insulating plastic, for example by injection molding because the measures according to the invention already make it possible to achieve a high degree of shielding.

For reliable shielding from RF in the region of the plug S as well, the base trough W, that is to say the first housing section W, has in fact a bay E which has metallic or metal-coated walls B. In the assembled state of the housing W/D, the walls B of the bay E, or their metal coatings, are therefore at housing potential, that is to say, for example, at ground potential. In the invention, the bay E/B is open at only one of its side faces referred to as the "open side face" facing the inside Q of the housing, and in particular in such a way that the bay E/B has edges C lying in a single plane and facing the open the face, said edges C of the bay E/B being at the potential of the metallic or metal-coated walls B concerned of the bay E/B, that is to say at housing potential in the assembled state of the housing W/D.

The open side face is covered, in the case of the invention, by a section of the printed circuit board L in the assembled state of the housing W/D. In this connection, the printed circuit board L is coated with a conducting layer over a large area of its printed circuit board section facing the bay E/B and containing the plug terminals P in such a way that strips of the layer M rest, in the assembled state of the housing W/D, on the edges C of the bay E/B so that the layer M covers the bay E/B, the layer M also being at housing potential in the assembled state of the housing W/D.

This covering of the open side face of the bay E/B with the layer M of the printed circuit board L achieves the sealing, aimed at by the invention, of the circuit from RF interference in the plug region as well, even if the plug S itself is essentially composed of insulating plastic, that is to say it is transparent to RF interference. At relatively low cost, the invention therefore achieves the desired reliable, relatively easily manageable mass production, that is to say, for example, even the reliable and, nevertheless low-cost mass production of motor-vehicle air-bag control circuits shielded from RF interference.

The shielding in the region of the open side face can be improved still further if a further conducting layer Z (cf. the layer Z in the Figures) which is connected during subsequent operation, that is to say in the assembled state of the housing W/D, to a potential which is constant with respect to the housing potential, that is to say, for example, also to the housing potential or to a suitable direct voltage that is in each case provided over a large area in at least one further printed circuit board level on and/or in the printed circuit board L, specifically on the printed circuit board section facing the bay E/B and containing the plug terminals P, a plurality of conducting layers M, Z situated one above the other covering the bay E/B over a large area in the assembled state of the housing W/D and ensuring a particularly good RF shielding in the region of the open side face of the bay E/B.

Without high cost, the printed circuit board can be mounted between the base trough and the lid in a virtually gap-free manner and, consequently, with shielding from RF interference if the printed circuit board L is metal-coated at least largely, if not right round its circumference in a U shape (cf. O/A/U in FIG. 2). For this purpose, the printed circuit board L is therefore metal-coated both along its outside edge A and is also coated on its two edge strips 0, U which are immediately adjacent laterally to the outside edge A (upper and lower in FIG. 2) and conductingly connected to the outside edge A. For this virtually gap-free assembly, it is also beneficial to give the printed circuit board L a contour A which is such that the first (in FIG. 2: lower) edge strip U of the printed circuit board L rests as tightly as possible, in the assembled state of the housing W/D, on a shoulder face (cf. H in the two figures) which extends around the base trough W, the shoulder faces H then being at housing potential. The printed circuit board L may, however, be pressed firmly by means of screws (cf. the threaded bores V in FIG. 1) onto the edges C and shoulder faces H shown in the two figures. It is furthermore beneficial to shape the lid D in such a way that the second (in FIG. 2: upper) edge strip 0 of the printed circuit board L is covered as tightly as possible with the respective peripheral edge of the lid D. In this connection, however, the lid D may also be pressed, by means of the screws V shown, onto the printed circuit board L.

Sealing a housing containing a printed circuit board in this way by skillfully clamping it between the lid D and the base trough W and by means of a U-shape metal coating of the printed circuit board edge has an inherently separate significance and is a subject covered by the present protective right even without providing the bay E/B and the plug S.

In order to be able to mount the printed circuit board L between the base trough W and the lid D in a manner which is as gap-free as possible and, consequently, with shielding from RF interference without high manufacturing cost in the production of the components concerned and without high cost in the subsequent assembly of the components, the various metal-coated strips (cf. C, O, U) of the printed circuit board L at which (cf. C) the printed circuit board L rests on the edges C of the bay E/B and/or at which (cf. O, U) the printed circuit board L makes contact with the housing sections (cf. H, D) along its circumference A may additionally be thickly coated at the strips with soldering material, for example with tin. In that case, the soft, pliable soldering material is in fact pressed particularly tightly onto the respective edges of the housing sections and, consequently, sealed in a particularly gap-free manner (cf. C) with respect to the walls of the bay E/D and (cf. W/H and D) on the one hand, with respect to the edge strip U, which is then thickly coated with soldering material and makes contact with the shoulder face H, and with respect to the edge strip O, which is then also thickly covered with soldering material and makes contact with the peripheral edge of the lid D.

The measure last mentioned, namely thickly covering the respective strips of the printed circuit board L with soldering material, can be additionally supplemented by skillfully preparing the respective edges contacted by the soldering material in order to seal the printed circuit board L particularly well between the walls B of the bay E/B and/or between the trough wall W and the lid D in a gap-free manner and, consequently, with particularly good shielding from RF interference; and, in particular, this is achieved without high additional production cost in producing the respective shoulder faces H and without additional assembly cost in the subsequent assembly of the respective components L, W, D: for this purpose the edges C and/or shoulder faces H at least of individual W of the housing sections W, D, which are contacted in the assembled state of the housing W/D by the soldering material under pressure, for example by screwing (V) may be roughened. In that case, the soft soldering material is in fact pressed under pressure into the roughened edges, as a result of which the sealing is particularly good.

Although other modifications and changes may be suggested by those skilled in the art, it is the intention of the inventors to embody within the patent warranted hereon all changes and modifications as reasonably and properly come within the scope of their contribution to the art.

I claim:

1. A metallic or metal coated housing which provides shielding against radio frequency radiation, comprising:

a first housing section and a second housing section, a printed circuit board mounted in said housing and supporting at least a part of a circuit, a plug in said first housing section having plug terminals connected to said circuit, a bay in said first housing section having metallic or metal coated walls and in which said plug is arranged, said bay having an opening with edges lying in a single plane facing said printed circuit board, which covers said opening said printed circuit board having an electrically conductive layer over a large area facing said opening with strips of said electrically conducting layer resting on edges of said opening so that said electrically conducting layer is at housing potential.

2. A metallic or metal coated housing as claimed in claim 1, further comprising: a further conducting layer, which is connected in an assembled state of the housing to a potential which is constant with respect to the housing potential, on said printed circuit board in each case over a large area in at least one further printed circuit board level on a printed circuit board section facing said bay and containing said plug terminals, a plurality of conducting layers situated one above another covering said bay over a large area in an assembled state of the housing.

3. A metallic or metal coated housing as claimed in claim 1, wherein said metal coating is, at least partly, at a circumference in a U shape and is also on edge strips of said printed circuit board immediately adjacent laterally to an outside edge and conductingly connected to said outside edge, said printed circuit board being of a contour which is such that a first edge strip rests as tightly as possible, in an assembled state of the housing, on a shoulder face which extends around said first housing section and is at housing potential, and a second edge strip of said printed circuit board being covered as tightly as possible with a peripheral edge of said second housing section.

4. A metallic or metal coated housing as claimed in claim 3, further comprising: a thick coating of solder material on said metal coating.

5. A metallic or metal coated housing as claimed in claim 4, wherein the edges of the housing sections which are contacted in the assembled state of the housing by the soldering material under pressure are roughened.

* * * * *